(12) United States Patent
Arai

(10) Patent No.: US 11,201,240 B2
(45) Date of Patent: Dec. 14, 2021

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Masatoshi Arai, Hakusan Ishikawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/013,372

(22) Filed: Sep. 4, 2020

(65) Prior Publication Data
US 2021/0296491 A1    Sep. 23, 2021

(30) Foreign Application Priority Data

Mar. 19, 2020    (JP) .............................. JP2020-050008

(51) Int. Cl.
*H01L 29/78*    (2006.01)
*H01L 29/40*    (2006.01)
(Continued)

(52) U.S. Cl.
CPC ...... *H01L 29/7813* (2013.01); *H01L 27/2454* (2013.01); *H01L 29/1095* (2013.01);
(Continued)

(58) Field of Classification Search
CPC ............. H01L 29/7813; H01L 29/4236; H01L 29/407; H01L 29/1095; H01L 29/7827; H01L 27/2454
See application file for complete search history.

(56) References Cited

U.S. PATENT DOCUMENTS

| 9,525,059 B1* | 12/2016 | Kobayashi | .......... H01L 29/0878 |
| 2011/0210406 A1 | 9/2011 | Terrill et al. | |
| 2017/0222038 A1* | 8/2017 | Katou | ............... H01L 29/42376 |

FOREIGN PATENT DOCUMENTS

| JP | 2011199109 A | 10/2011 |
| JP | 5444731 B2 | 3/2014 |

(Continued)

*Primary Examiner* — Joseph C. Nicely
(74) *Attorney, Agent, or Firm* — Kim & Stewart LLP

(57) ABSTRACT

A semiconductor device includes: a first semiconductor layer of first conductivity type; a second semiconductor layer of first conductivity type provided on the first semiconductor layer and having a first region and a second region; a first semiconductor region of second conductivity type provided on the first region; a second semiconductor region of first conductivity type provided on the first semiconductor region; a second electrode provided in a first trench reaching the first region from above the first semiconductor region, the second electrode facing the first semiconductor region via a first insulating film, the second electrode being electrically connected to a first electrode provided above the first semiconductor layer; a fourth electrode provided below the second electrode in the first trench, the fourth electrode facing the first region via a second insulating film, the fourth electrode being electrically connected to a third electrode provided on the second semiconductor region and electrically connected to the second semiconductor region; a third semiconductor region of second conductivity type provided on the second region; a fourth semiconductor region of first conductivity type provided on the third semiconductor region; a fifth electrode provided in a second trench reaching the second region from above the third semiconductor region, the fifth electrode facing the third semiconductor region via a third insulating film, the fifth electrode being electrically connected to the first electrode; and a sixth electrode provided below the fifth
(Continued)

electrode in the second trench, the sixth electrode facing the second region via a fourth insulating film, the sixth electrode being electrically connected to the first electrode.

6 Claims, 8 Drawing Sheets

(51) Int. Cl.
    *H01L 29/10* (2006.01)
    *H01L 29/423* (2006.01)
    *H01L 27/24* (2006.01)

(52) U.S. Cl.
    CPC ........ *H01L 29/407* (2013.01); *H01L 29/4236* (2013.01); *H01L 29/7827* (2013.01)

(56) References Cited

FOREIGN PATENT DOCUMENTS

| | | | |
|---|---|---|---|
| JP | 2017085112 A | 5/2017 | |
| JP | 2017139262 A | 8/2017 | |
| WO | 2011050115 A2 | 4/2011 | |

\* cited by examiner

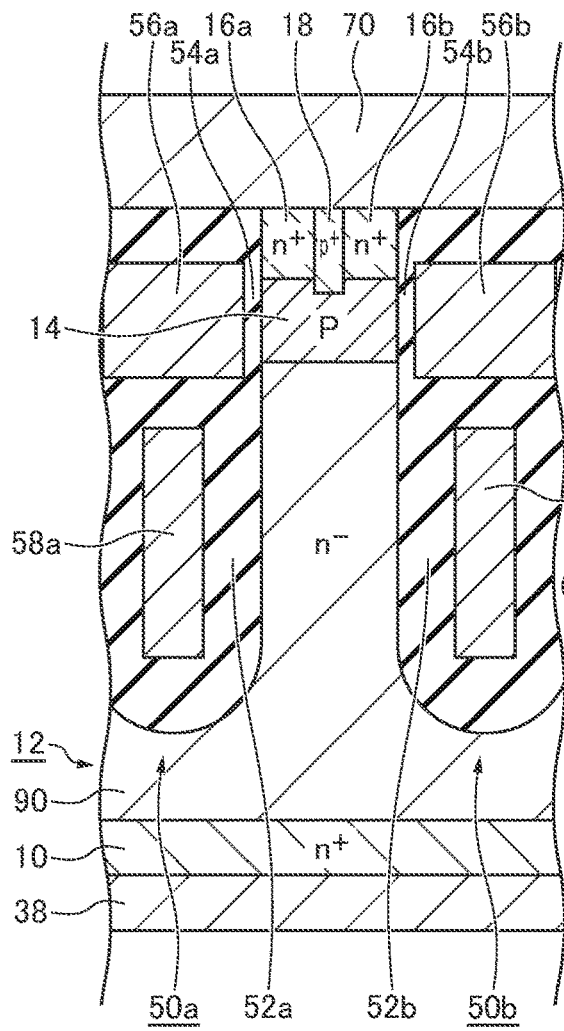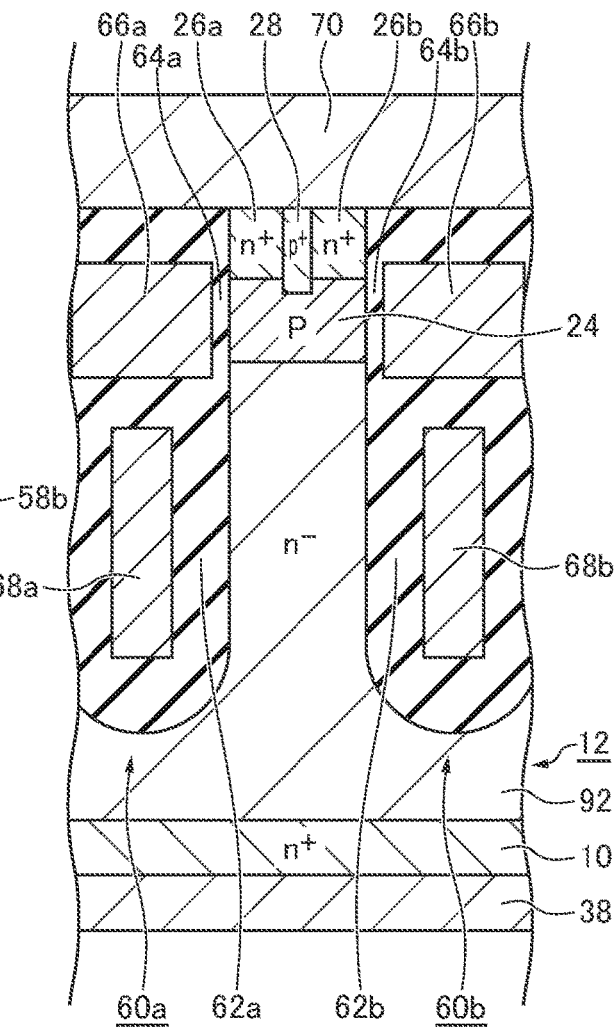

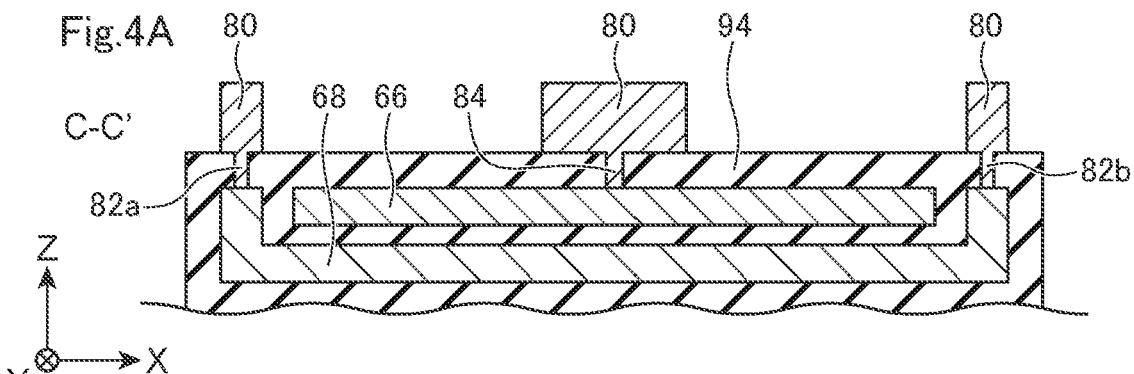
Fig.4A C-C'
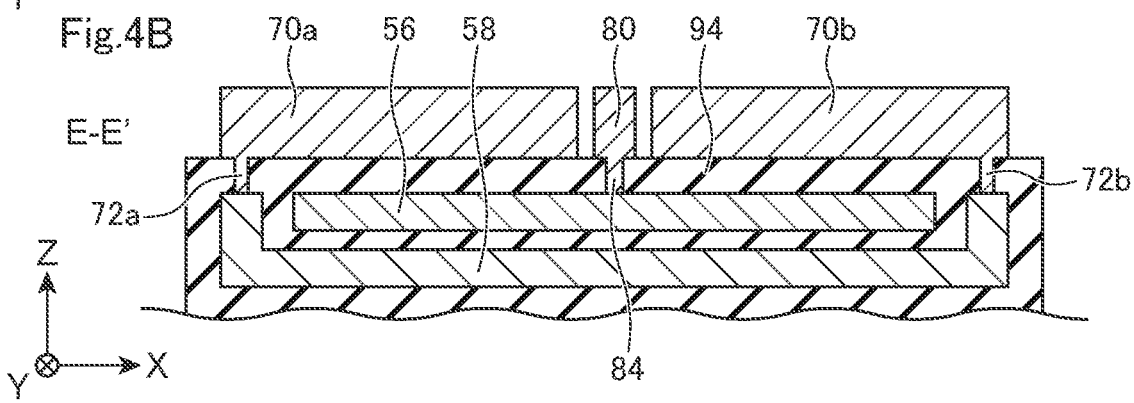
Fig.4B E-E'
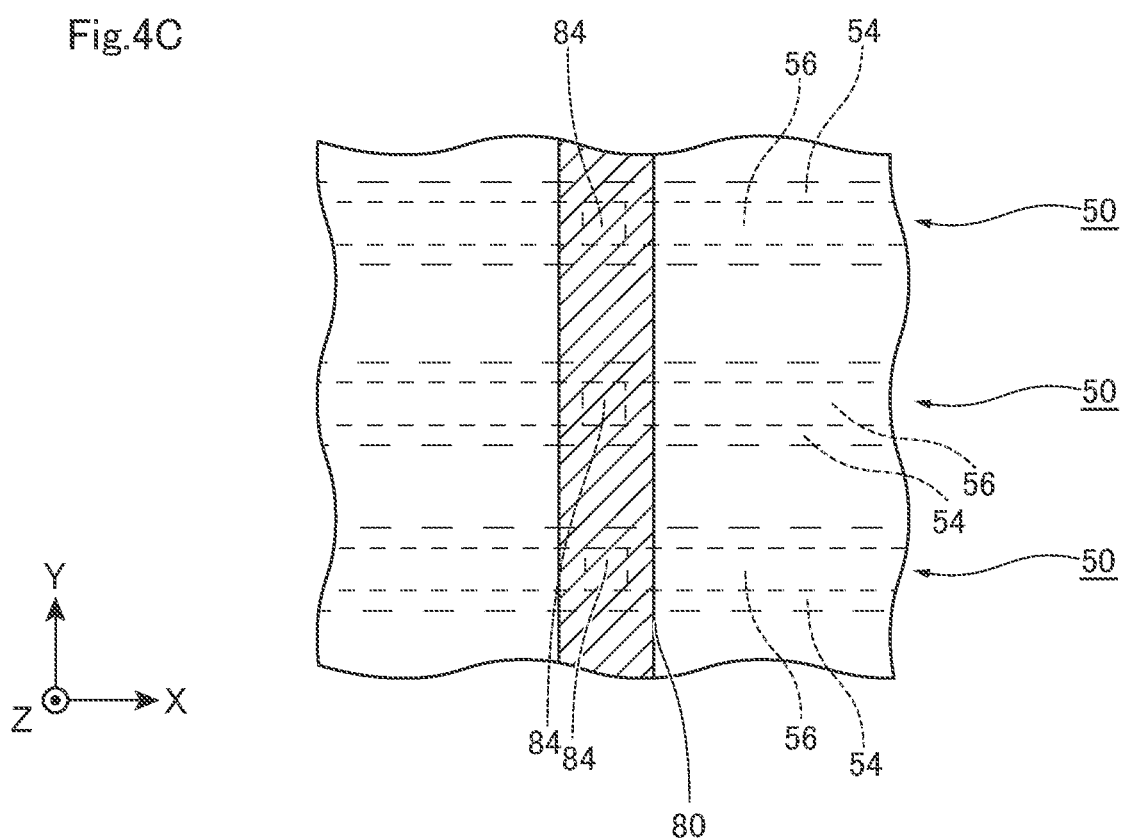
Fig.4C

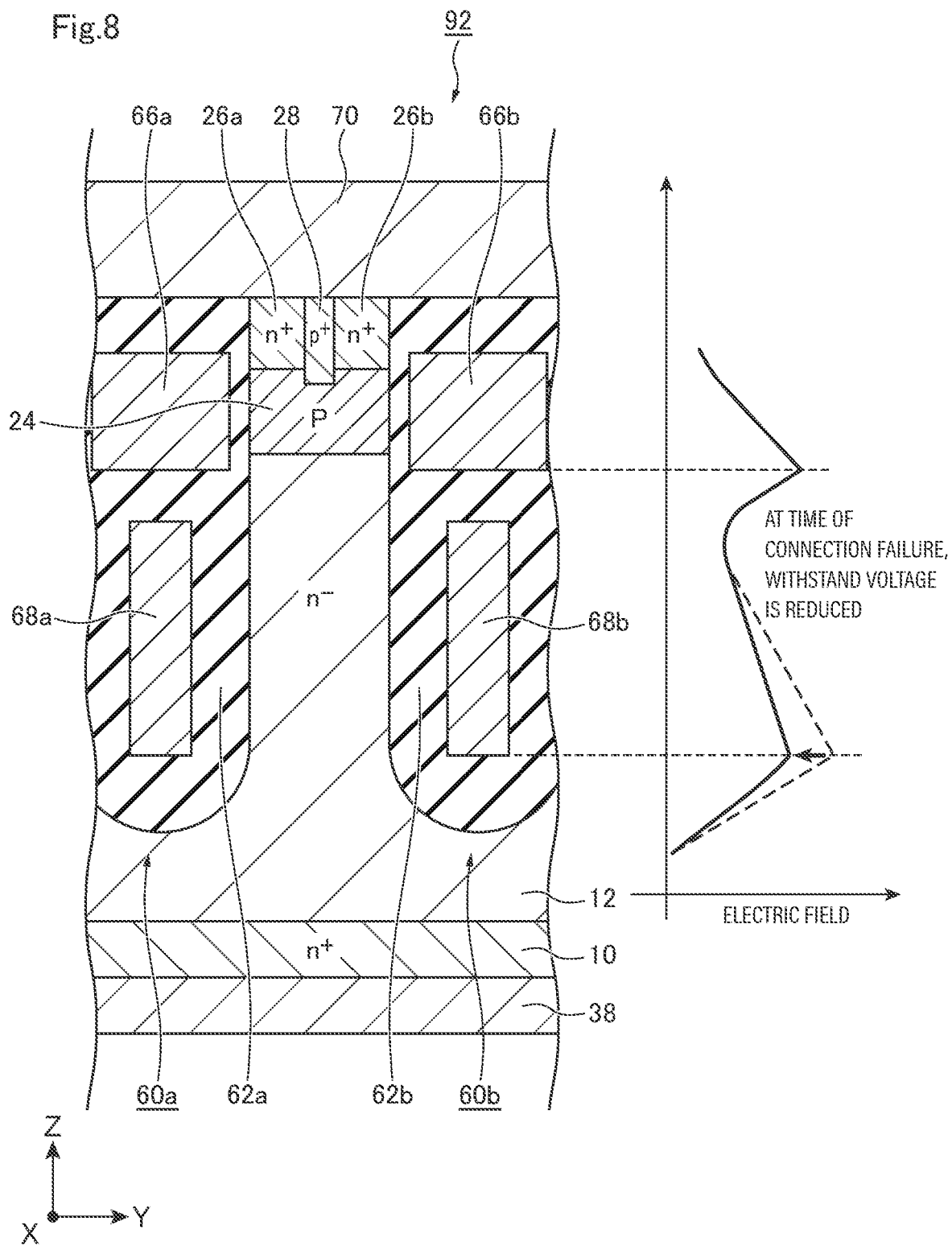

SEMICONDUCTOR DEVICE

CROSS-REFERENCE TO RELATED APPLICATION

This application is based upon and claims the benefit of priority from Japanese Patent Application No. 2020-050008, filed on Mar. 19, 2020, the entire contents of which are incorporated herein by reference.

FIELD

Embodiments described herein relate generally to a semiconductor device.

BACKGROUND

A semiconductor device having a semiconductor chip, such as a metal oxide semiconductor field effect transistor (MOSFET), is used for power conversion and the like. When the semiconductor device described above is a vertical MOSFET, a gate electrode and a source electrode are connected to, for example, a gate metal and a source metal provided on an upper surface of the MOSFET.

BRIEF DESCRIPTION OF THE DRAWINGS

FIGS. 2A and 2B are schematic cross-sectional views of a main part of the semiconductor device according to the embodiment;

FIGS. 4A to 4C are schematic cross-sectional views of a main part of the semiconductor device according to the embodiment;

FIG. 8 is a schematic view for explaining a function and an effect of the semiconductor device according to the embodiment.

DETAILED DESCRIPTION

Figure 1:
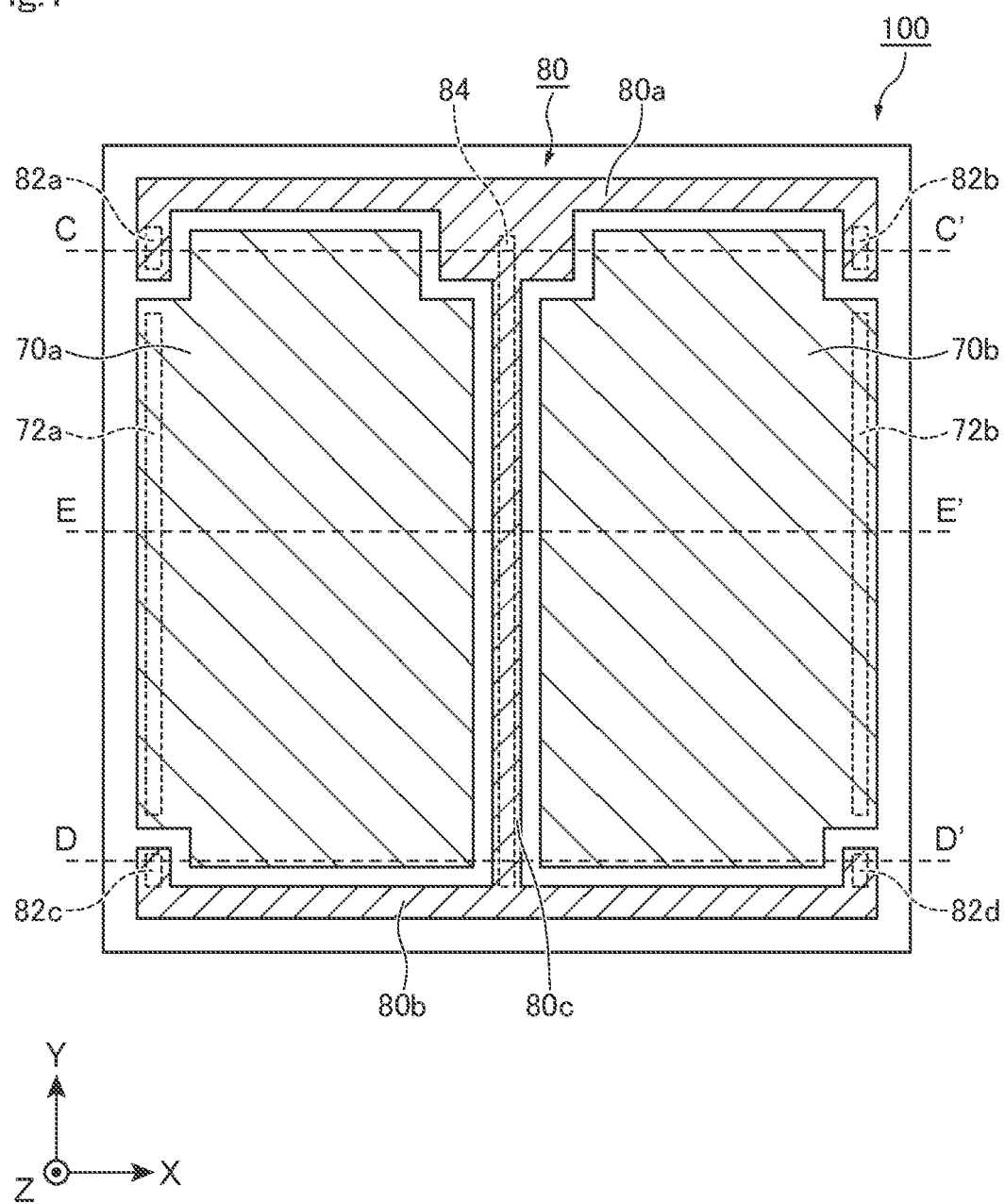
FIG. 1 is a schematic top view of a semiconductor device according to an embodiment.

A semiconductor device according to an embodiment includes: a first semiconductor layer of first conductivity type; a second semiconductor layer of first conductivity type provided on the first semiconductor layer and having a first region and a second region; a first semiconductor region of second conductivity type provided on the first region; a second semiconductor region of first conductivity type provided on the first semiconductor region; a second electrode provided in a first trench reaching the first region from above the first semiconductor region, the second electrode facing the first semiconductor region via a first insulating film, the second electrode being electrically connected to a first electrode provided above the first semiconductor layer; a fourth electrode provided below the second electrode in the first trench, the fourth electrode facing the first region via a second insulating film, the fourth electrode being electrically connected to a third electrode provided on the second semiconductor region and electrically connected to the second semiconductor region; a third semiconductor region of second conductivity type provided on the second region; a fourth semiconductor region of first conductivity type provided on the third semiconductor region; a fifth electrode provided in a second trench reaching the second region from above the third semiconductor region, the fifth electrode facing the third semiconductor region via a third insulating film, the fifth electrode being electrically connected to the first electrode; and a sixth electrode provided below the fifth electrode in the second trench, the sixth electrode facing the second region via a fourth insulating film, the sixth electrode being electrically connected to the first electrode.

Hereinafter, embodiments of the present disclosure will be described with reference to the drawings. Note that in the following description, the same members and the like are denoted by the same reference numerals, and description of members and the like once described is appropriately omitted.

Here, upward in the drawings is described as "up", and downward in the drawings is described as "down" in order to indicate a positional relationship of parts and the like. Here, the terms "up" and "down" do not necessarily indicate a relationship with the direction of gravity.

Hereinafter, a case where a first conductivity type is $n^-$ type and a second conductivity type is $p^-$ type will be exemplified.

In the following description, notations of $n^+$, n, $n^-$, $p^+$, p, and $p^-$ indicate a relative level of an impurity concentration of each of the conductivity types. That is, $n^+$ indicates that an impurity concentration of $n^-$ type is relatively higher than n, and $n^-$ indicates that the impurity concentration of $n^-$ type is relatively lower than n. $p^+$ indicates that an impurity concentration of $p^-$ type is relatively higher than p, and $p^-$ indicates that the impurity concentration of $p^-$ type is relatively lower than p. Note that $n^+$ type and $n^-$ type may be simply referred to as n type, and $p^+$ type and $p^-$ type may be simply referred to as p type.

Embodiment

A semiconductor device according to an embodiment includes: a first semiconductor layer of first conductivity type; a second semiconductor layer of first conductivity type provided on the first semiconductor layer and having a first region and a second region; a first semiconductor region of second conductivity type provided on the first region; a second semiconductor region of first conductivity type provided on the first semiconductor region; a second electrode provided in a first trench reaching the first region from above the first semiconductor region, the second electrode facing the first semiconductor region via a first insulating film, the second electrode being electrically connected to a first electrode provided above the first semiconductor layer; a fourth electrode provided below the second electrode in the first trench, the fourth electrode facing the first region via a second insulating film, the fourth electrode being electrically connected to a third electrode provided on the second semiconductor region and electrically connected to the second semiconductor region; a third semiconductor region of second conductivity type provided on the second region; a fourth semiconductor region of first conductivity type provided on the third semiconductor region; a fifth electrode provided in a second trench reaching the second region from above the third semiconductor region, the fifth electrode facing the third semiconductor region via a third insulating film, the fifth electrode being electrically connected to the first electrode; and a sixth electrode provided below the fifth electrode in the second trench, the sixth electrode facing the second region via a fourth insulating film, the sixth electrode being electrically connected to the first electrode.

FIG. 1 is a schematic top view of a semiconductor device 100 according to the embodiment. The semiconductor device 100 is a vertical MOSFET.

Figure 3:
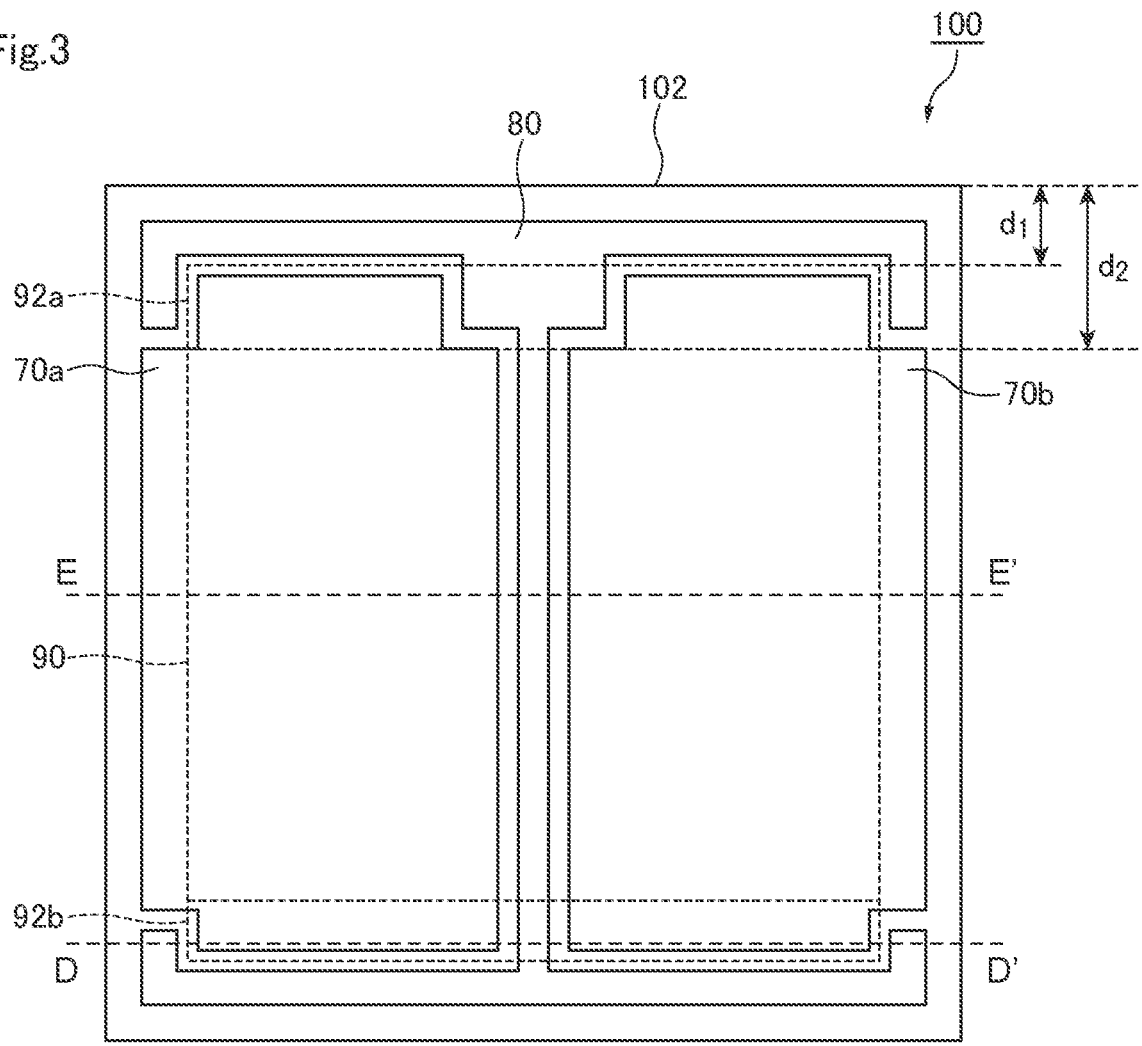
FIG. 3 is a schematic top view of the semiconductor device according to the embodiment.

Here, an X direction, a Y direction perpendicular to the X direction, and a Z direction perpendicular to the X direction and the Y direction are defined. The semiconductor device 100 is a semiconductor chip having a chip surface parallel to an XY plane as illustrated in FIG. 1 or 3. For example, the shape of such a semiconductor chip in a plane parallel to the XY plane is a square as illustrated in FIG. 1 or 3. However, the shape of such a semiconductor chip in a plane parallel to the XY plane is not limited to a square, of course. The XY plane is a plane perpendicular to a direction in which a drain layer 10 and a drift layer 12 described later are stacked.

FIG. 1 illustrates a source pad (an example of the third electrode) 70 and a gate pad (an example of the first electrode) 80 provided on an upper surface of the semiconductor device 100. The gate pad 80 has portions 80a and 80b extending in the X direction in an upper part and a lower part in FIG. 1, respectively. The gate pad 80 has a portion 80c extending in the Y direction. Both ends of the portion 80c are connected to the portions 80a and 80b, respectively. FIG. 1 illustrates a source pad 70a and a source pad 70b as the source pad 70. In FIG. 1, the source pad 70a and the source pad 70b are provided so as to sandwich the portion 80c therebetween. In other words, the portion 80c is provided between the source pad 70a and the source pad 70b. However, the shapes of the source pad 70 and the gate pad 80 are not limited to those illustrated in FIG. 1.

FIGS. 2A and 2B are schematic cross-sectional views of a main part of the semiconductor device 100 according to the embodiment. FIG. 3 is a schematic top view of the semiconductor device 100 according to the embodiment.

FIG. 2A is a schematic cross-sectional view of a first region 90 of the semiconductor device 100 according to the embodiment and the vicinity of the first region 90 in a plane parallel to a YZ plane. FIG. 2B is a schematic cross-sectional view of a main part of a second region 92 of the semiconductor device 100 according to the embodiment and the vicinity of the second region 92 in a plane parallel to the YZ plane.

The drain layer (an example of the first semiconductor layer) 10 functions as a drain of the MOSFET. The drain layer 10 contains, for example, a semiconductor material of $n^+$ type.

A drain electrode 38 is provided under the drain layer 10 and is electrically connected to the drain layer 10. The drain electrode 38 functions as a drain electrode of the MOSFET.

The drift layer 12 (second semiconductor layer) is provided on the drain layer 10. The drift layer 12 functions as a drift layer of the MOSFET. The drift layer 12 contains, for example, a semiconductor material of $n^-$ type.

FIG. 3 is a diagram for explaining a positional relationship between the first region 90 and the second region 92. The drift layer 12 has the first region 90 and the second region 92. FIG. 3 illustrates a second region 92a and a second region 92b as a plurality of the second regions 92. A distance $d_1$ between an end portion 102 of the semiconductor device (semiconductor chip) and the second region 92a is shorter than a distance $d_2$ between the end portion 102 of the semiconductor device (semiconductor chip) and the first region 90. The second region 92 is provided closer to the end portion 102 side of the semiconductor device (semiconductor chip) than the first region 90. The first region 90 is provided between the second region 92a and the second region 92b. Note that, in FIG. 3, the shapes of the first region 90 and the second region 92 in a plane parallel to the XY plane are rectangles. However, the shapes of the first region 90 and the second region 92 in a plane parallel to the XY plane are not limited to rectangles, of course. A C-C' cross section (FIG. 1) is provided in the second region 92a, a D-D' cross section (FIGS. 1 and 3) is provided in the second region 92b, and an E-E' cross section (FIGS. 1 and 3) is provided in the first region 90.

The first region 90 is preferably larger than the second region 92 in a plane parallel to the XY plane. However, the first region 90 may have the same size as the second region 92, and the first region 90 may be smaller than the second region 92.

A first base region (an example of the first semiconductor region) 14 is provided on the first region 90 of the drift layer 12. The first base region 14 functions as a base of the MOSFET. The first base region 14 forms a channel and allows carriers to flow between a first source region 16 and the drain layer 10 when a voltage is applied to a first gate electrode 56. The first base region 14 contains, for example, a semiconductor material of $p^-$ type.

The first source region (an example of the second semiconductor region) 16 is provided on the first base region 14. The first source region 16 functions as a source of the MOSFET. When an appropriate voltage is applied to the first gate electrode 56, carriers flow between the first source region 16 and the drain layer 10. The first source region 16 contains, for example, a semiconductor material of $n^+$ type. The source pad 70 is provided on the first source region 16 and is electrically connected to the first source region 16. FIG. 2A illustrates a first source region 16a and a first source region 16b as the first source region 16.

A first contact region 18 is provided on the first base region 14. For example, the first contact region 18 is provided between the first source region 16a and the first source region 16b. The first contact region 18 contains, for example, a semiconductor material of $p^+$ type. The first contact region 18 is provided in order to make it difficult for avalanche breakdown to occur by providing a region having high hole conductivity.

A first trench 50 is formed so as to reach the first region 90 of the drift layer 12 from above the first base region 14. FIG. 2A illustrates a first trench 50a and a first trench 50b as the first trench 50.

A second insulating film 52 is provided in the first trench 50. FIG. 2A illustrates a second insulating film 52a and a second insulating film 52b as the second insulating film 52. The second insulating film 52a is provided in the first trench 50a, and the second insulating film 52b is provided in the first trench 50b.

A first insulating film 54 is provided on the second insulating film 52 in the first trench 50. FIG. 2A illustrates a first insulating film 54a and a first insulating film 54b as the first insulating film 54. The first insulating film 54a is provided on the second insulating film 52a in the first trench 50a, and the first insulating film 54b is provided on the second insulating film 52b in the first trench 50b.

The first gate electrode 56 (an example of the second electrode) is provided so as to face the first base region 14 via the first insulating film 54. As described later, the first gate electrode 56 is electrically connected to the gate pad 80. The first gate electrode 56 functions as a gate of the MOSFET. In FIG. 2A, a first gate electrode 56a and a first gate electrode 56b as the first gate electrode 56 are provided. The first gate electrode 56a is provided in the first trench 50a. The first gate electrode 56b is provided in the first trench 50b.

A first field plate electrode (an example of the fourth electrode) 58 is provided below the first gate electrode 56 in the first trench 50 so as to face the first region 90 of the drift layer 12 via the second insulating film 52. FIG. 2A illustrates a first field plate electrode 58a and a first field plate electrode 58b as the first field plate electrode 58. The first field plate electrode 58b is provided so as to face the first region 90 of the drift layer 12 via the second insulating film 52b.

A second base region (an example of the third semiconductor region) 24 is provided on the second region 92 of the drift layer 12. The second base region 24 functions as a base of the MOSFET. The second base region 24 forms a channel and allows carriers to flow between the second source region 26 and the drain layer 10 when a voltage is applied to the second gate electrode 66. The second base region 24 contains, for example, a semiconductor material of p⁻ type.

The second source region (an example of the fourth semiconductor region) 26 is provided on the second base region 24. The second source region 26 functions as a source of the MOSFET. When an appropriate voltage is applied to the second gate electrode 66, carriers flow between the second source region 26 and the drain layer 10. The second source region 26 contains, for example, a semiconductor material of n⁺ type. The source pad 70 is provided on the second source region 26 and is electrically connected to the second source region 26. FIG. 2B illustrates a second source region 26a and a second source region 26b as the second source region 26.

A second contact region 28 is provided on the second base region 24. For example, the second contact region 28 is provided between a second source region 26a and a second source region 26b. The second contact region 28 contains, for example, a semiconductor material of p⁺ type. The second contact region 28 is provided in order to make it difficult for avalanche breakdown to occur by providing a region having high hole conductivity.

A second trench 60 is formed so as to reach the second region 92 of the drift layer 12 from above the second base region 24. FIG. 2B illustrates a second trench 60a and a second trench 60b as the second trench 60.

A fourth insulating film 62 is provided in the second trench 60. FIG. 2B illustrates a fourth insulating film 62a and a fourth insulating film 62b as the fourth insulating film 62. The fourth insulating film 62a is provided in the second trench 60a, and the fourth insulating film 62b is provided in the second trench 60b.

A third insulating film 64 is provided on the fourth insulating film 62 in the second trench 60. FIG. 2B illustrates a third insulating film 64a and a third insulating film 64b as the third insulating film 64. The third insulating film 64a is provided on the fourth insulating film 62a in the second trench 60a, and the third insulating film 64b is provided on the fourth insulating film 62b in the second trench 60b.

The second gate electrode 66 (an example of the fifth electrode) is provided so as to face the second base region 24 via the third insulating film 64. As described below, the second gate electrode 66 is electrically connected to the gate pad 80. The second gate electrode 66 functions as a gate of the MOSFET. In FIG. 2B, a second gate electrode 66a and a second gate electrode 66b as the second gate electrode 66 are provided. The second gate electrode 66a is provided in the second trench 60a. The second gate electrode 66b is provided in the second trench 60b.

The second field plate electrode (an example of the sixth electrode) 68 is provided below the second gate electrode 66 in the second trench 60 so as to face the second region 92 of the drift layer 12 via the fourth insulating film 62. FIG. 2B illustrates a second field plate electrode 68a and a second field plate electrode 68b as the second field plate electrode 68. The second field plate electrode 68b is provided so as to face the second region 92 of the drift layer 12 via the fourth insulating film 62b.

In other words, in the first region 90, the first gate electrode 56 and the first field plate electrode 58 are connected to each other such that the first gate electrode 56 has a gate potential via the gate pad 80, and the first field plate electrode 58 has a source potential via the source pad 70. Meanwhile, in the second region 92, the second gate electrode 66 and the second field plate electrode 68 are connected to each other so as to have a gate potential via the gate pad 80.

FIGS. 4A to 4C are schematic cross-sectional views of a main part of the semiconductor device 100 according to the embodiment. FIG. 4A is a schematic cross-sectional view of a C-C' cross section (FIG. 1) of the semiconductor device 100 according to the embodiment. FIG. 4B is a schematic cross-sectional view of an E-E' cross section (FIGS. 1 and 3) of the semiconductor device 100 according to the embodiment. FIG. 4C is a schematic top view illustrating the vicinity of a connection electrode 84 of the semiconductor device 100 according to the embodiment. Note that a schematic cross-sectional view of a D-D' cross-section (FIGS. 1 and 3) is substantially similar to the schematic cross-sectional view of the C-C' cross-section, and is therefore omitted.

The source pad 70 and the gate pad 80 are provided above the first gate electrode 56 and the second gate electrode 66 via an interlayer insulating film (an example of the fifth insulating film) 94.

For example, in the first region 90, a plurality of the first trenches 50 each extending in the X direction is provided. In each of the first trenches 50, the first gate electrode 56 and the first field plate electrode 58 extend in the X direction.

For example, in the second region 92, a plurality of the second trenches 60 each extending in the X direction is provided. In each of the second trenches 60, the second gate electrode 66 and the second field plate electrode 68 each extend in the X direction.

The first gate electrode 56 and the second gate electrode 66 are electrically connected to the gate pad 80 via the connection electrode 84 (an example of a first connection electrode and a second connection electrode). The first field plate electrode 58 is electrically connected to the source pad 70 via a connection electrode 72a (an example of a fourth connection electrode) and a connection electrode 72b (an example of the fourth connection electrode). The second field plate electrode 68 is electrically connected to the gate pad 80 using a connection electrode 82a (an example of a third connection electrode) and a connection electrode 82b (an example of the third connection electrode).

The connection electrodes 72a, 72b, 82a, 82b, and 84 are provided in the interlayer insulating film 94. The connection electrodes 72a and 72b preferably each contain, for example, a predetermined first conductive material contained in the source pad 70 because of easy manufacturing. The connection electrodes 82a, 82b, and 84 preferably each contain, for example, a predetermined second conductive material contained in the gate pad 80 because of easy manufacturing.

Note that the connection electrode 84 is not electrically connected to the drift layer 12, the first base region 14, the first source region 16, the first contact region 18, the second base region 24, the second source region 26, or the second contact region 28. The connection electrode 84 electrically connects the respective first gate electrodes 56 provided in the first trenches 50 and the respective second gate electrodes 66 provided in the second trenches 60 to the gate pad 80.

The connection electrode 72 is not electrically connected to the drift layer 12, the first base region 14, the first source region 16, the first contact region 18, the second base region 24, the second source region 26, or the second contact region 28. The connection electrode 72 electrically connects the respective first field plate electrodes 58 provided in the first trenches 50 to the source pad 70.

The connection electrode 82 is not electrically connected to the drift layer 12, the first base region 14, the first source region 16, the first contact region 18, the second base region 24, the second source region 26, or the second contact region 28. The connection electrode 82 electrically connects a plurality of the second field plate electrodes 68 provided in the second trenches 60 to the gate pad 80.

In FIG. 1, the connection electrodes 72a, 72b, 82a, 82b, and 84 are illustrated as if each of the connection electrodes 72a, 72b, 82a, 82b, and 84 is formed in a single opening in the interlayer insulating film 94 for ease of illustration. However, for example, as illustrated in FIG. 4C, the connection electrodes 84 are provided in contact holes formed in the interlayer insulating film 94 immediately above a plurality of the first gate electrodes 56, respectively. Similarly, the connection electrodes 84 are provided in contact holes formed in the interlayer insulating film 94 immediately above a plurality of the second gate electrodes 66, respectively. The connection electrodes 72a and 72b are provided in contact holes formed in the interlayer insulating film 94 immediately above the first field plate electrode 58, respectively, in a similar manner to the connection electrode 84. The connection electrodes 82a and 82b are provided in contact holes formed in the interlayer insulating film 94 immediately above the second field plate electrode 68, respectively, in a similar manner to the connection electrode 84.

Note that, as illustrated in FIG. 1, when the semiconductor device 100 is viewed from above, a part of the source pad 70a is provided between the connection electrode 82a and the connection electrode 84. When the semiconductor device 100 is viewed from above, a part of the source pad 70b is provided between the connection electrode 82b and the connection electrode 84.

A semiconductor material used for the drain layer 10, the drift layer 12, the first base region 14, the first source region 16, the first contact region 18, the second base region 24, the second source region 26, and the second contact region 28 is, for example, silicon (Si). However, the semiconductor material used for the drain layer 10, the drift layer 12, the first base region 14, the first source region 16, the first contact region 18, the second base region 24, the second source region 26, and the second contact region 28 may be another semiconductor material such as silicon carbide (SiC), gallium nitride (GaN), or gallium arsenide (GaAs).

When silicon is used as the semiconductor material, for example, arsenic (As), phosphorus (P), or antimony (Sb) can be used as n⁻ type impurities, and boron (B) can be used as p⁻ type impurities.

The first gate electrode 56, the first field plate electrode 58, the second gate electrode 66, and the second field plate electrode 68 each contain a conductive material such as polysilicon containing impurities.

The first insulating film 54, the second insulating film 52, the third insulating film 64, the fourth insulating film 62, and the interlayer insulating film 94 each contain an insulating material such as silicon oxide or silicon nitride (SiN).

The source pad 70, the gate pad 80, the connection electrode 84, the connection electrode 72a, the connection electrode 72b, the connection electrode 82a, and the connection electrode 82b each contain, for example, a metal material such as aluminum (Al) or copper (Cu) (an example of the predetermined first conductive material and the predetermined second conductive material).

Note that, between the above-described metal material and the above-described semiconductor material, conductive material such as polysilicon, or insulating material, a barrier metal containing, for example, titanium (Ti), titanium nitride (TiN), tantalum (Ta), or tantalum nitride (TaN) may be appropriately provided.

Next, a function and an effect of the semiconductor device 100 according to the embodiment will be described.

Figure 5:
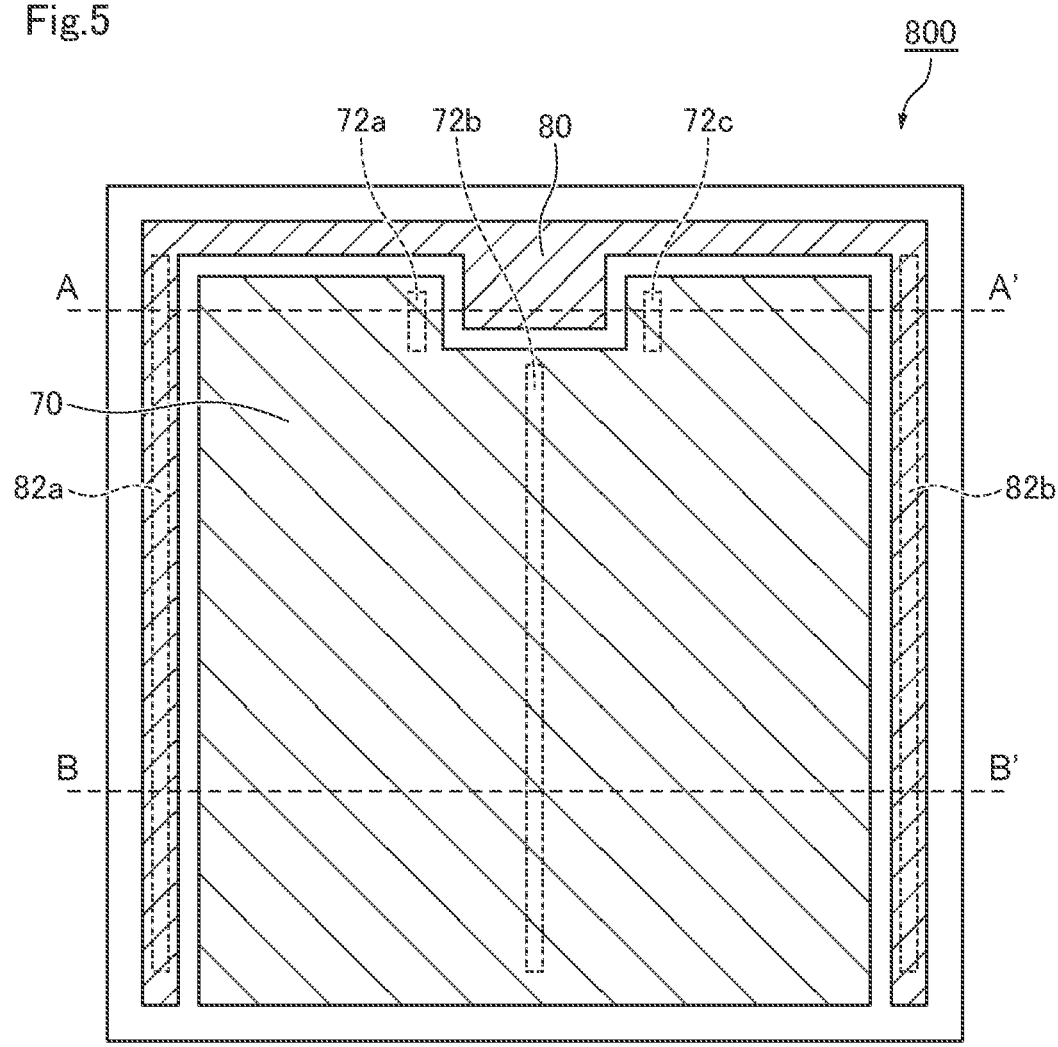
FIG. 5 is a schematic top view of a semiconductor device according to a comparative embodiment.
Figure 6:
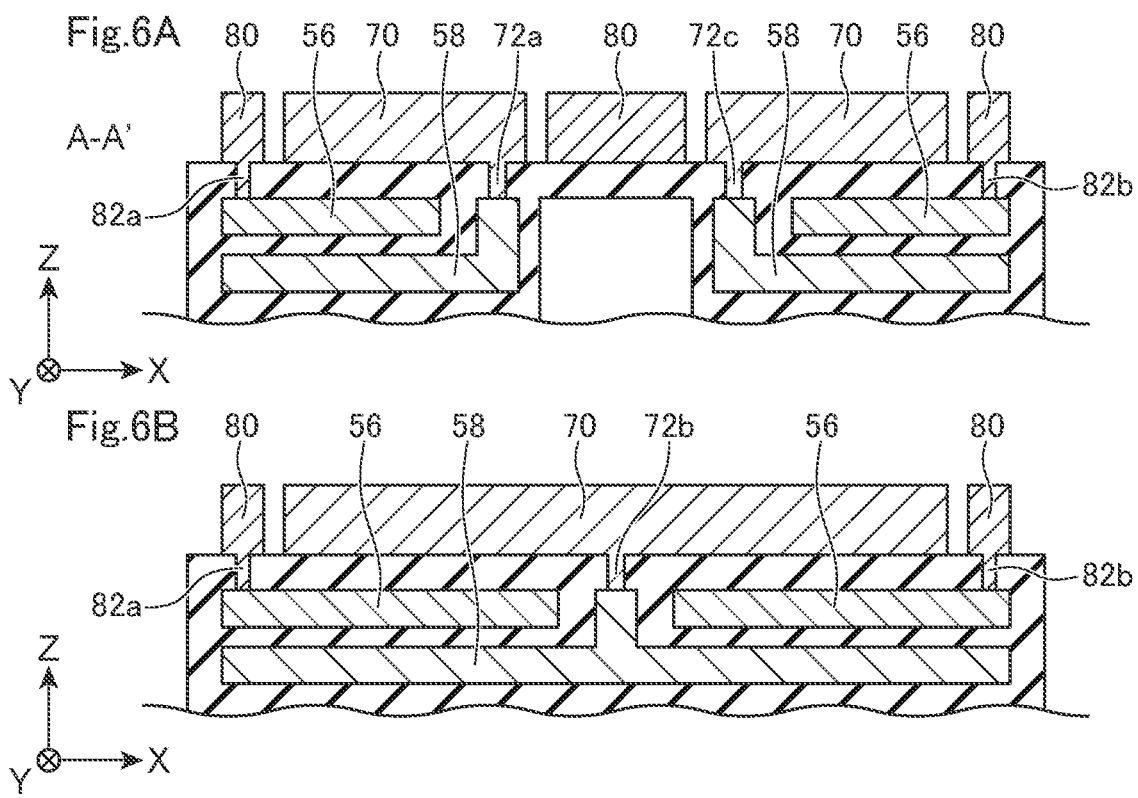
FIGS. 6A and 6B are schematic cross-sectional views of a main part of the semiconductor device according to the comparative embodiment.
Figure 7:
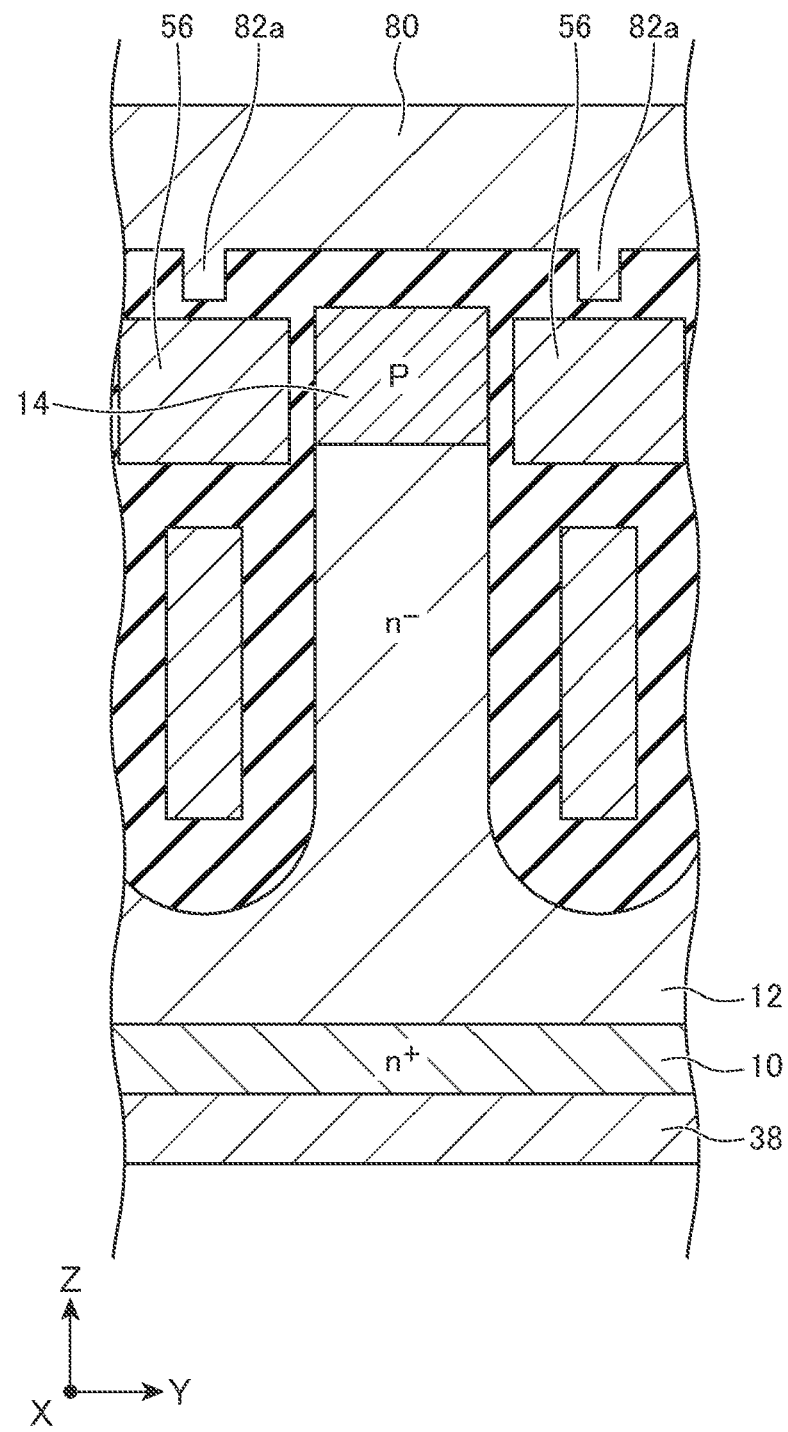
FIG. 7 is a schematic cross-sectional view of a main part of the semiconductor device according to the comparative embodiment.

FIG. 5 is a schematic top view of a semiconductor device 800 according to a comparative embodiment. FIGS. 6A and 6B are schematic cross-sectional views of a main part of the semiconductor device 800 according to the comparative embodiment. FIG. 6A is a schematic cross-sectional view of an A-A' cross section (FIG. 5) of the semiconductor device 800 according to the comparative embodiment. FIG. 6B is a schematic cross-sectional view of a B-B' cross section (FIG. 5) of the semiconductor device 800 according to the comparative embodiment. FIG. 7 is a schematic cross-sectional view of a main part of the semiconductor device 800 according to the comparative embodiment. FIG. 7 is a schematic cross-sectional view of the semiconductor device 800 according to the comparative example in a cross section parallel to a YZ plane including a connection electrode 82a.

In the semiconductor device 800 according to the comparative embodiment, unlike the semiconductor device 100, a first region 90 or a second region 92 is not provided. A first gate electrode 56 is electrically connected to a gate pad 80 via the connection electrode 82a or a connection electrode 82b. A first field plate electrode 58 is electrically connected to a source pad 70 via a connection electrode 72a, a connection electrode 72b, or a connection electrode 72c. In other words, in the semiconductor device 800 according to the comparative embodiment, the first gate electrode 56 and the first field plate electrode 58 are connected to each other such that the first gate electrode 56 has a gate potential via the gate pad 80, and the first field plate electrode 58 has a source potential via the source pad 70.

An electric circuit such as a gate driver is connected to a gate electrode of the MOSFET, and an electric signal is sent to the gate electrode. In order to control the MOSFET with such an electric signal, it is preferable for a value of gate resistance Rg not to vary. For that purpose, it is preferable to clarify an electrical connection failure between the gate pad 80 and the first gate electrode 56 in an inspection before shipping a product. Here, it is desirable to measure a value of gate resistance Rg after the MOSFET formed on a chip is packaged. However, since packaging requires a lot of labor, it has been required to easily clarify an electrical connection failure between the gate pad 80 and the first gate electrode 56 in the MOSFET on the chip before packaging.

In this respect, by measuring a withstand voltage of the MOSFET, it is possible to clarify an electrical connection failure between the gate pad 80 and the first gate electrode 56. Since the withstand voltage of the MOSFET can be tested in a state where the MOSFET is formed on a wafer before being formed into a chip, the withstand voltage can be more easily measured. However, for example, as illustrated in FIG. 7, since electrical connection between the first gate electrode 56 and the gate pad 80 is not made via the connection electrode 82a, even if an electrical connection failure actually occurs between the gate pad 80 and the first gate electrode 56, an electric field is formed by a PN junction provided between a first base region 14 and a first source region 16. Therefore, even if such a connection failure occurs, the MOSFET has a withstand voltage to some extent. Therefore, an electrical connection failure between the gate pad 80 and the first gate electrode 56 cannot be sufficiently confirmed, disadvantageously.

FIG. 8 is a schematic view for explaining a function and an effect of the semiconductor device 100 according to the embodiment.

The semiconductor device 100 according to the embodiment includes the second field plate electrode 68 provided below the second gate electrode 66 in the second trench 60 so as to face the second region 92 via the fourth insulating film 62 and electrically connected to the gate pad 80. In this way, in the second region 92, when a connection failure between the gate pad 80 and the second field plate electrode 68 occurs and the second field plate electrode 68 is in a floating state, electric field strength is largely reduced. Therefore, the withstand voltage is largely reduced. Therefore, such a connection failure can be clarified by an easy-to-measure method for measuring a withstand voltage.

The above-described connection failure is likely to occur near an outer periphery of the chip. Therefore, by providing the second region 92 at a position close to an end portion of the chip, such a connection failure can be easily found. Therefore, a distance between the end portion 102 of the semiconductor chip and the second region 92a is preferably shorter than a distance between the end portion 102 of the semiconductor chip and the first region 90. In a sense that the second region 92 is provided in an end portion of the chip, it is preferable to provide a plurality of the second regions 92 and to provide the first region 90 between the second regions 92 (for example, the second region 92a and the second region 92b).

Characteristics as the MOSFET differ depending on whether the field plate electrode has a gate potential or a source potential. Therefore, it is preferable to make the first region 90 larger than the second region 92 such that the number of MOSFETs in which a field plate electrode has a gate potential is not so large.

The above-described connection failure is more likely to occur when a connection electrode is provided in the interlayer insulating film 94 and connection between the gate pad 80 and the first gate electrode 56 is performed by such a connection electrode. Therefore, in such a case, it is preferable to apply the semiconductor device according to the embodiment.

The semiconductor device 100 according to the embodiment can provide a semiconductor device having high reliability.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a first semiconductor layer of first conductivity type;
   a second semiconductor layer of first conductivity type provided on the first semiconductor layer and having a first region and a second region;
   a first semiconductor region of second conductivity type provided on the first region;
   a second semiconductor region of first conductivity type provided on the first semiconductor region;
   a second electrode provided in a first trench reaching the first region from above the first semiconductor region, the second electrode facing the first semiconductor region via a first insulating film, the second electrode being electrically connected to a first electrode provided above the first semiconductor layer;
   a fourth electrode provided below the second electrode in the first trench, the fourth electrode facing the first region via a second insulating film, the fourth electrode being electrically connected to a third electrode provided on the second semiconductor region and electrically connected to the second semiconductor region;
   a third semiconductor region of second conductivity type provided on the second region;
   a fourth semiconductor region of first conductivity type provided on the third semiconductor region;
   a fifth electrode provided in a second trench reaching the second region from above the third semiconductor region, the fifth electrode facing the third semiconductor region via a third insulating film, the fifth electrode being electrically connected to the first electrode; and
   a sixth electrode provided below the fifth electrode in the second trench, the sixth electrode facing the second region via a fourth insulating film, the sixth electrode being electrically connected to the first electrode.

2. The semiconductor device according to claim 1, wherein
   the semiconductor device is a semiconductor chip, and
   the second region is provided closer to an end portion side of the semiconductor chip than the first region.

3. The semiconductor device according to claim 2, wherein the semiconductor device has a plurality of the second regions, and the first region is provided between the second regions.

4. The semiconductor device according to claim 1, wherein the first region in a plane perpendicular to a direction in which the first semiconductor layer and the second semiconductor layer are stacked has a larger size than the second region in the plane.

5. The semiconductor device according to claim 1, wherein
   the first electrode is provided above the second electrode via a fifth insulating film,
   the first electrode is electrically connected to the second electrode via a first connection electrode provided in the fifth insulating film,
   the first electrode is electrically connected to the fifth electrode via a second connection electrode provided in the fifth insulating film,
   the first electrode is electrically connected to the sixth electrode via a third connection electrode provided in the fifth insulating film, and the third electrode is electrically connected to the fourth electrode via a fourth connection electrode provided in the fifth insulating film.

6. The semiconductor device according to claim 5, wherein the third electrode is provided between the second connection electrode and the third connection electrode when the semiconductor device is viewed from above.

* * * * *